United States Patent [19]

Tsuno

[11] 4,412,132
[45] Oct. 25, 1983

[54] ELECTRON LENS EQUIPPED WITH THREE MAGNETIC POLE PIECES

[75] Inventor: Katsushige Tsuno, Akishimashi, Japan

[73] Assignee: JEOL Ltd., Tokyo, Japan

[21] Appl. No.: 281,562

[22] Filed: Jul. 8, 1981

[51] Int. Cl.³ .................. H01J 29/64; G01N 23/00
[52] U.S. Cl. ............................................ 250/396 ML
[58] Field of Search .......... 250/396 ML, 396 R, 311; 313/361

[56] References Cited

U.S. PATENT DOCUMENTS 2,714,678  8/1955  Wolff .......................... 250/396 ML
4,219,732  8/1980  Nakagawa et al. ......... 250/396 ML

FOREIGN PATENT DOCUMENTS 55-1187     1/1980  Japan ........................ 250/396 ML
57-2087138  5/1982  Japan ........................ 250/396 ML

*Primary Examiner*—Bruce C. Anderson
*Attorney, Agent, or Firm*—Webb, Burden, Robinson & Webb

[57] ABSTRACT

An electron lens equipped with three magnetic pole pieces defining two gaps forms two magnetic fields. The magnetic fields are generated in said gaps by opposite and same strength excitation. S1/S2 ratio is in the range of 2.7 to 3.8, in which S1 represents the first gap length between the upper and middle magnetic pole pieces and S2 represents the second gap between the middle and lower magnetic pole pieces, so that radial (isotropic) distortion is eliminated and spiral (anisotropic) distortion is extremely reduced.

5 Claims, 8 Drawing Figures

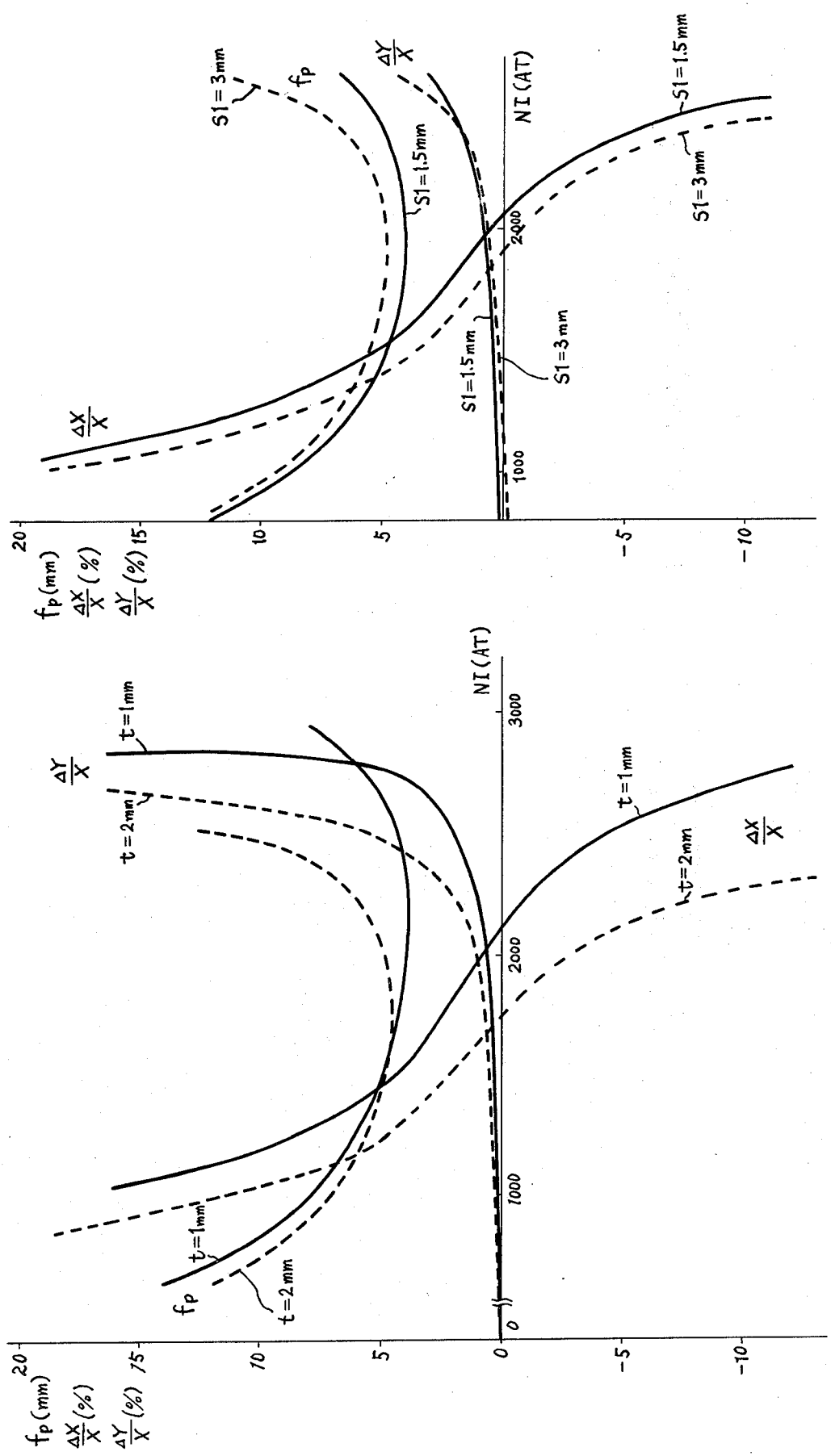

ELECTRON LENS EQUIPPED WITH THREE MAGNETIC POLE PIECES

BACKGROUND OF THE INVENTION

This invention relates to an electron lens which can reduce both radial and spiral distortions in a transmission electron microscope.

The aberrations which must be carefully avoided in the design of a projector lens for an electron microscope include radial distortion, spiral distortion, chromatic aberration of rotation, and chromatic aberration of magnification. The radial (isotropic) distortion, which presents a more important problem than any other kind of aberration, can be substantially eliminated in a low magnification range, where the projector lens is magnetized with less lens excitation, by virtue of the so-called distortion-free system (U.S. Pat. No. 3,188,465) in which a higher barrel type distortion is created in an intermediate lens to cancel a pincushion type distortion caused by the projector lens. In a medium magnification range where a fixed amount of electric current is applied to the projector lens, however, no such cancelling can be expected since the pincushion type distortion caused by the projector lens is overwhelmingly greater than the barrel type distortion caused by the intermediate lens, and there is inevitably a distortion of, say, 1 to 2% along the circumference of a circle having a diameter of 100 mm on a fluorescent screen.

There has hitherto been no effective method for eliminating spiral (anisotropic) distortion. All that has been done in the past was to make the distance between the projector lens and film surface as long as possible, and utilize only the electron beams passing in the vicinity of the central axis, so that the aberration may not easily be noticeable. According to this method, however, it is difficult to reduce the aberration to a level of 2% or less, because it is not adapted to basically reduce the aberration, and also because certain spatial restrictions are imposed on the apparatus which is available for carrying out the method.

It has recently been proposed to use a projector lens a lens equipped with three magnetic pole pieces defining two gaps of opposite excitation, and this lens has been found capable of eliminating radial distortion completely. It has also been found that this lens can reduce spiral distortion to a level not possible by any other type lens. The lens, however, does not eliminate spiral distortion completely, and if it is desired to achieve a low spiral distortion of 1% or less, there is no alternative but to use the lens in a range of lens excitation in which radial distortion increases.

FIG. 1 is a view showing schematically the electron lens proposed prior to this invention. In the figure, two excitation coils 1 and 2, which are connected in series and supplied with the current (I) from a lens power supply 3, are enveloped by a ferromagnetic yoke 4 and non-ferromagnetic spacers 5 and 6. Inside the yoke 4, the upper pole piece 7, middle pole piece 8 and lower pole piece 9 and their non-ferromagnetic spacers 10 and 11 are installed. The shape of the lens is nearly symmetrical with respect to the center of the middle pole piece 8. The upper d1, middle d2, and lower d3 pole bore diameters are all 3 mm, and the first gap length S1 between the upper and middle pole pieces is equal to the second gap length S2 between the middle and lower pole pieces. The turn number (N) of each lens coil, 1 and 2, is the same and the winding direction of each coil is determined so that polarity of the magnetic field appearing in the first and second gaps is opposite to each other and the magnetic field appearing in the first and second gaps is generated by the same excitation intensity.

FIG. 2 shows the focal length fp (mm), radial distortion $\Delta X/X$ (%) and spiral distortion $\Delta Y/X$ (%) of the lens shown in FIG. 1 in relation to the excitation (magnetomotive force) NI (ampere turns), using the thickness t of the middle pole piece 2 as a parameter. The graph shown refers to a lens having an equal bore diameter d1, d2 or d3 of 3 mm, and equal pole gap length S1 or S2 of 2.25 mm, and a middle pole piece thickness t of 1 mm and 2 mm. The graph shown is measured at a point apart from the optical axis (r=50 mm) on a fluorescent screen (or film) which is located under the projector lens by L=386.5 mm. Further, the graph shown is obtained under the condition in which accelerating voltage of the electron beam equals 100 KV. In the event that accelerating voltage does not equal 100 KV, the following conversion equation is established $$\frac{(NI)_{100\,kv}}{\sqrt{109785}} = \frac{NI}{\sqrt{V^*}}$$

where:

V* = Accelerating voltage (V) of the electron beam
(NI) = Value of NI (ampere turns) in the case that accelerating voltage of the electron beam equal V*.
$(NI)$ 100 KV = Value of NI (ampere turns) in FIG. 2.

As is noted from FIG. 2, the focal length fp shows a minimum value at the excitation NI of 2,200 and 1,800 AT (ampere turns) when the middle pole thickness t is 1 mm and 2 mm, respectively. The minimum values of the focal length are 3.8 mm, and 4.6 mm when the thickness t is 1 mm and 2 mm, respectively. It is, thus, noted that a lens having a smaller thickness t of the middle pole piece has a smaller minimum value of focal length. The radial distortion $\Delta X/X$ shows a positive value (pincushion type) on the low excitation side and a negative value (barrel type) on the high excitation side. The excitation value at which the radial distortion becomes zero is substantially equal to that at which the focal length fp shows the minimum value. On the other hand, spiral distortion $\Delta Y/X$ is very small on the low excitation side, but shows a sharp increase with an increase in the excitation. And there is no situation in which the spiral distortion becomes zero. Accordingly, if the radial distortion $\Delta X/X$ is zero or at a very low level, the spiral distortion $\Delta Y/X$ cannot be reduced to zero.

If different amounts of excitation are applied to form magnetic fields in the two gaps between the magnetic pole pieces in the lens constructed as shown in FIG. 1, it is possible to eliminate any spiral distortion at certain amounts of excitation, but other defects, such as chromatic aberration of rotation, arise and prevent effective utilization of the features of a lens having three magnetic pole pieces.

SUMMARY OF THE INVENTION

According to this invention, therefore, there is provided an electron lens which can eliminate or minimize radial and spiral distortions when an equal amount of excitation is applied to form the magnetic fields appearing in the first and second gaps between the magnetic pole pieces. The lens is characterized by the asymmetric configuration of the magnetic pole pieces, i.e., S1/S2 ratio is in the range of 2.7 to 3.8, in which S1 represents the first gap length between the upper and middle magnetic pole pieces and S2 represents the second gap between the middle and lower magnetic pole pieces. In this lens, radial distortion is reduced to zero at the excitation where focal length is minimum. At this excitation, spiral distortion is also reduced.

DRAWINGS

The invention will now be described in further detail with the accompanying drawings.

FIG. 1 is a schematic drawing showing a prior lens equipped with three magnetic pole pieces, FIG. 2 is a graph for explaining the performance of the lens shown in FIG. 1, FIG. 3 is an essential part of one embodiment according to the invention, and FIGS. 4 to 8 are graphs showing measurements of focal properties and radial and spiral distortion in the embodiments according to this invention.

DESCRIPTION OF THE PREFERRED EMBODIMENT

Figure 3:
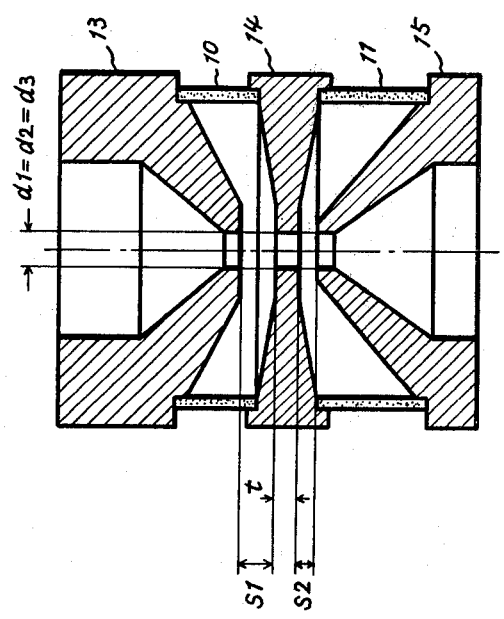

FIG. 3 shows the essential part of one embodiment according to the invention. In this embodiment, an upper magnetic pole piece 13, a middle magnetic pole piece 14 and a lower magnetic pole piece 15 have bore diameters d1, d2, d3, each 3 mm, and the first pole piece gap S1 between the upper and middle pole pieces is 3 mm and the second pole piece gap S2 between the middle and lower pole pieces is 1.5 mm, and the middle pole piece thickness t is 2 mm. In the above case and the modified case that the above S1 value is varied to 1.5 mm, the graph shown in FIG. 4 corresponding to FIG. 2 is measured. In FIG. 4, solid lines refer to case in which S1 is 1.5 mm, while the broken lines refer to case in which S1 is 3 mm.

It is noted from FIG. 4 that fp shows the minimum value in the vicinity of 2,000 AT, and that the radial distortion $\Delta X/X$ becomes zero in the vicinity of 2,000 AT. As regards the spiral distortion, it shows a steady increase with an increase of the excitation NI when S1 is equal to S2, but if S1 is 3 mm and S2 1.5 mm, hence the S1/S2 ratio being 2, the spiral distortion shows a negative value in a lower range of excitation and a positive value in a higher range of excitation. It is in the vicinity of 1,200 AT that the spiral distortion becomes zero.

The coefficient DSP for the spiral distortion is expressed by the following equation:

$$DSP = \int_{Za}^{Zb} \left\{ \frac{3}{128} \left(\frac{e}{mV^*}\right)^{\frac{3}{2}} \cdot \gamma_r^2 \cdot B^3 + \frac{1}{16} \left(\frac{e}{mV^*}\right)^{\frac{1}{2}} \cdot \gamma_r^2 \cdot B \right\} dZ \quad (1)$$

The relation between DSP and the spiral distortion $\Delta Y/X$ can be expressed by the following equation:

$$\Delta Y/X = DSP (Xfp/L)^2 \quad (2)$$

Figure 5:
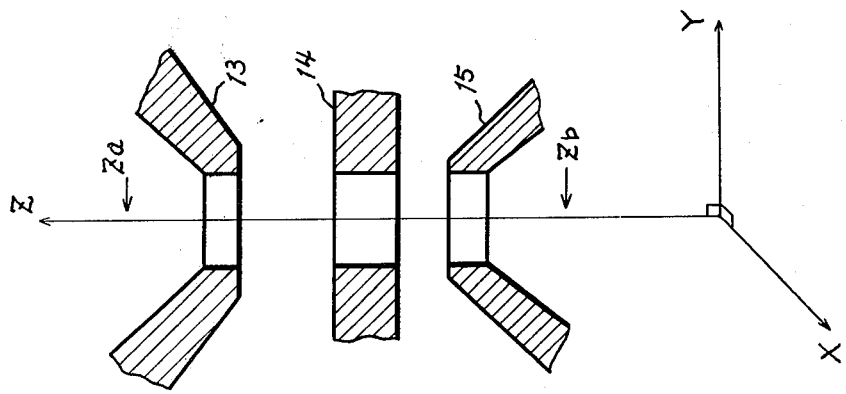

In equation (1), e/m stands for the ratio of electric charge to mass in the electron, $V^*$ stands for the accelerating voltage, Z stands for the optical axis of the lens, B stands for the strength of the magnetic field on the axis Z, Za and Zb stand for the upper and lower extremities, respectively, to which the influence of the magnetic field of the lens extends as shown in FIG. 5, $\gamma r$ stands for an electron beam path parallel to the axis Z apart from axis Z by amount "1" at Za, and $\gamma r'$ stands for differential value for axis Z. In equation (2), L stands for the distance between the projector lens and the film or screen surface.

Figure 6:
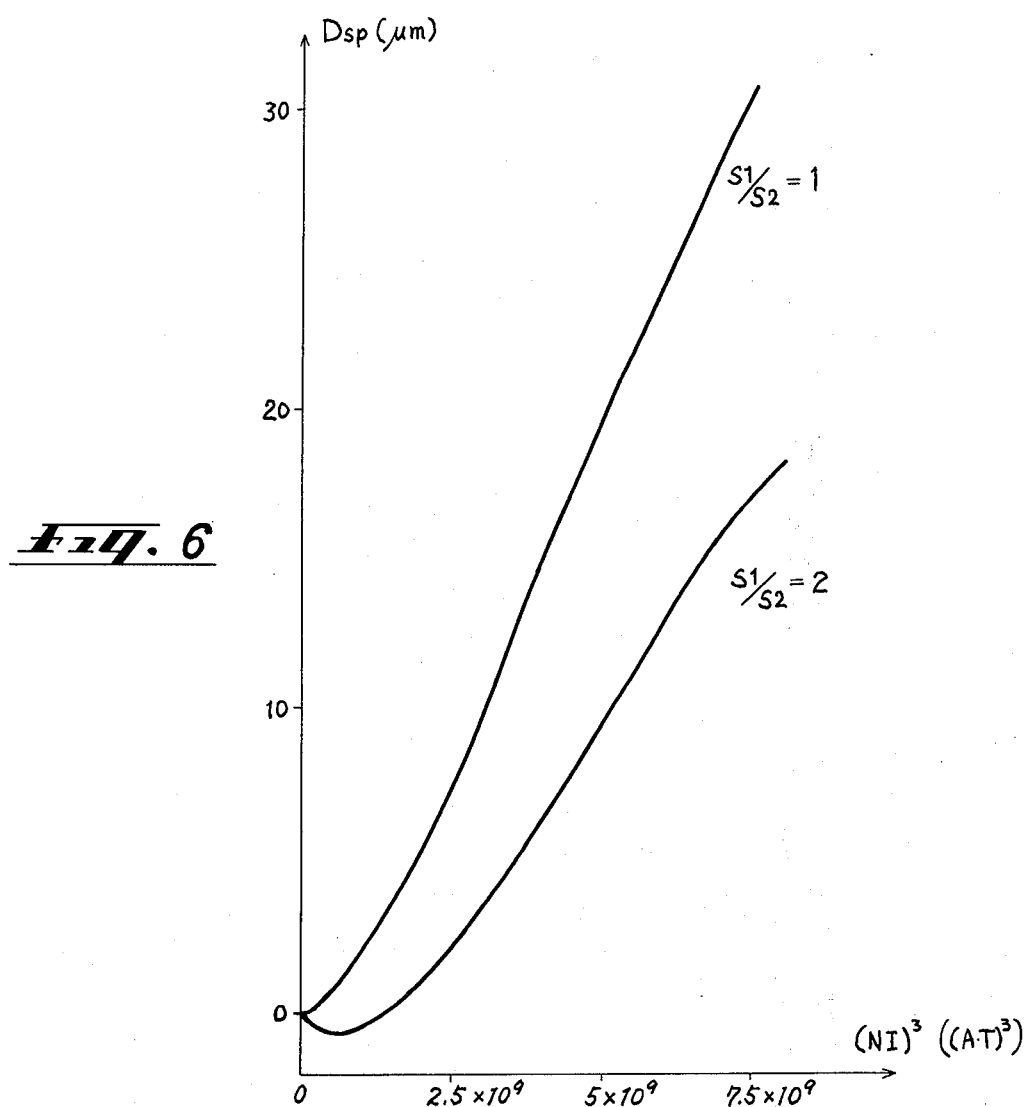

FIG. 6 plots the values of DSP obtained by conversion of $\Delta Y/X$ in FIG. 4 in relation to (NI). As NI can be expressed by the following equation, $$NI = \int_{Za}^{Zb} B \cdot dZ \quad (3)$$

it is possible to find out from FIG. 6 the contribution of the first and second terms of equation (1) to DSP. In case S1/S2 is 1, it can be concluded that DSP increases substantially in proportion to $(NI)^3$ which corresponds to B. In other words, the first term of equation (1), which contains $\gamma r^2 B^3$, shows an extremely high value at a high level of $\gamma r$ in a region having a strong magnetic field.

Figure 1:
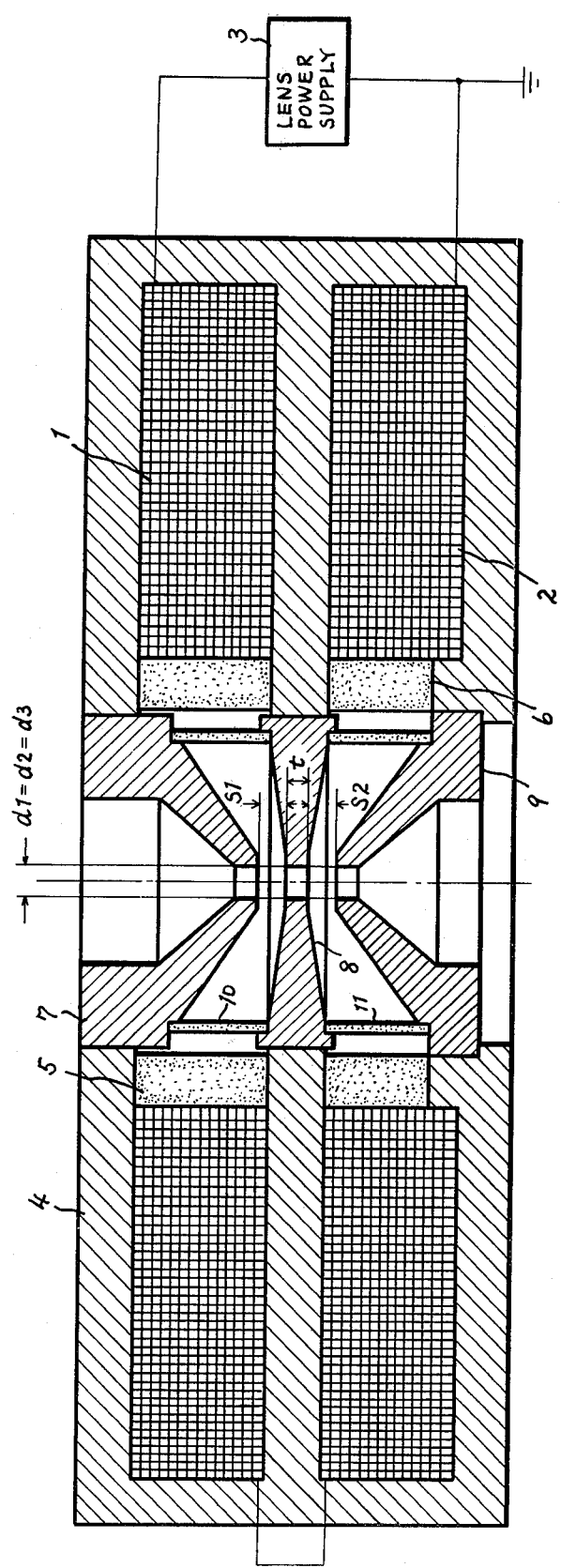
Figure 7:
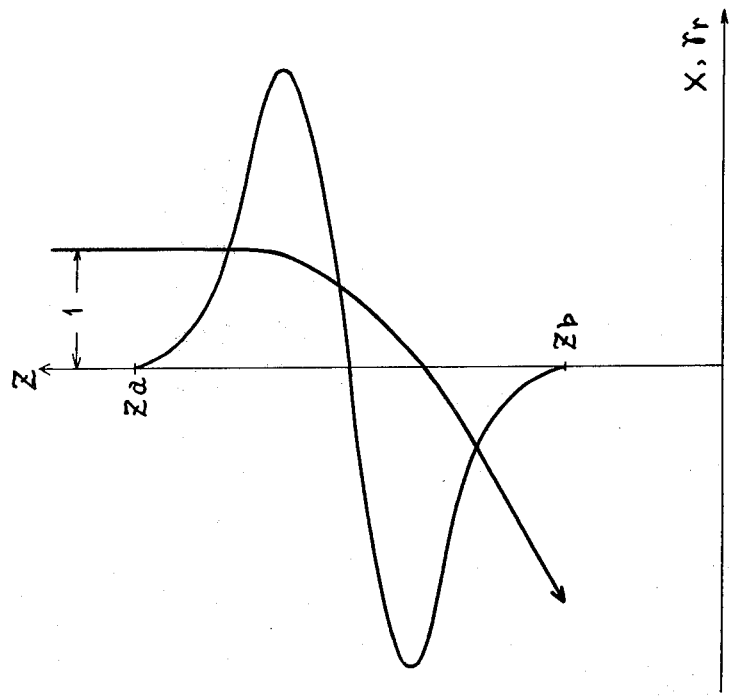

In the electron lens shown in FIG. 1, the value of $\gamma r$ is high in the space between the upper and middle magnetic pole pieces, and becomes zero in the vicinity of the maximum strength of the magnetic field in the space between the middle and lower magnetic pole pieces, as shown in FIG. 7. Accordingly, the width of the space between the upper and middle magnetic pole pieces contributes to DSP far more greatly than that between the middle and lower magnetic pole pieces. The distortion created in the latter space cannot cancel that created by the former space.

The values of DSP in the aforesaid two spaces can be cancelled with respect to each other under the condition that the values of DSP are equalized and given opposite polarities if the magnetic field in the space between the upper and middle magnetic pole pieces is lower in strength than that in the space between the middle and lower magnetic pole pieces so that the electron beam path may cross the axis at a point deviating from the position in which the magnetic field in the space between the middle and lower magnetic pole pieces shows the maximum strength. For that purpose, it is very effective to provide a wider space between the upper and middle magnetic pole pieces than between the middle and lower magnetic pole pieces.

Figure 8:
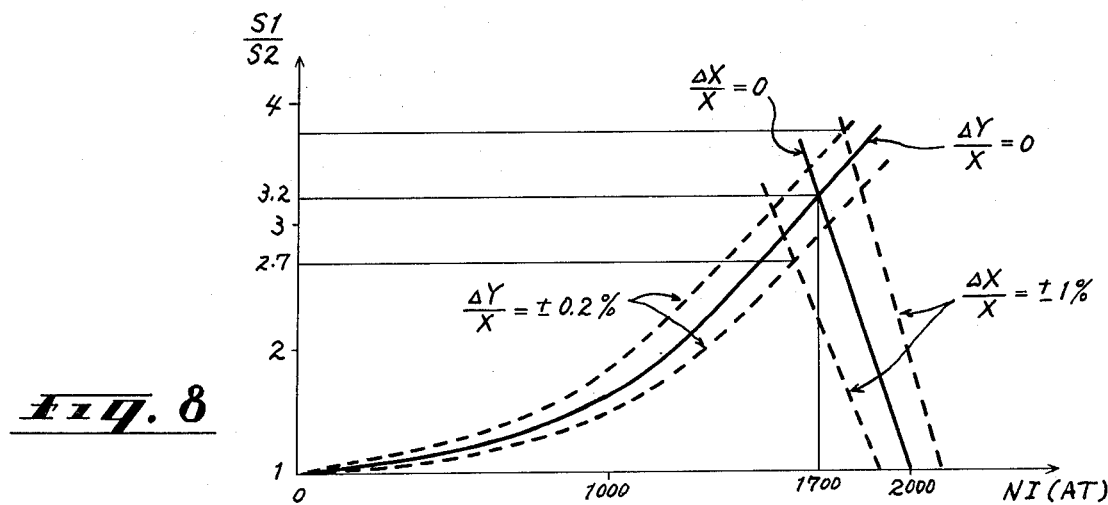

The curve shown by line in FIG. 8 represents an example of such effective arrangement, in which S1 (3 mm)/S2 (1.5 mm) is 2. There is a less linear relationship between DSP and $(NI)^3$ as shown in FIG. 6. Another feature that must not be overlooked lies in an increase of deviation from the linear relationship. This increase of deviation is due to the second term of equation (1) which contributes to the creation of the condition under which spiral distortion becomes zero.

Even if there is no spiral distortion, a lens is practically unless if any heavy radial distortion occurs, as already pointed out. Only the lens in which both of the radial and spiral distortions can be eliminated provides an effective electron lens.

FIG. 8 shows the magnetomotive force NI at which $\Delta X/X$ and $\Delta Y/X$ are both zero at different spacing ratios S1/S2. It is noted therefrom that both of the distortions become zero in the vicinity of the S1/S2 ratio of 3.2, and the NI value of 1,700 AT. As a matter of fact, however, other lenses, such as an intermediate lens, create a maximum spiral distortion of, say, plus or minus 1%, and a maximum spiral distortion of, say, plus or minus 0.2%. These distortions must be cancelled by those created by the projector lens. It is, therefore, necessary that the radial and spiral distortions $\Delta X/X$ and $\Delta Y/X$ of the projector lens be in the range of $-1\%$ to 1%, and $-0.2\%$ to 0.2%, respectively, instead of being exactly zero.

FIG. 8 indicates that these distortion ranges are available when S1/S2 is in the range of 2.7 to 3.8. If S1/S2 is in that range, both the distortions become distortions which can be eliminated, or reduced to nearly zero.

While in the example described above, the pole piece bore diameters d1, d2, and d3 are equal to one another, other combinations, represented as $d1 \geq d2 \geq d3$, are useful for future manifestation of the advantages of this invention, since those combinations contribute more effectively to creating a magnetic field having a lower degree of strength in the space between the upper and lower magnetic pole pieces than in the space between the middle and lower magnetic pole pieces so that the electron beam path may cross the optical axis Z at a point deviating from the position in which the magnetic field in the space between the middle and lower magnetic pole pieces shows the maximum strength.

Radial distortion is sometimes referred to as isotropic distortion. An electron that leaves an object point ($X_o$, $Y_o$) now intercepts the image plane at ($X_i$, $Y_i$), where, for example, $$X_i = M[X_o + DX_o(X_o^2 + Y_o^2)]$$

$$Y_i = M[Y_o + DY_o(X_o^2 + Y_o^2)]$$

where M is the magnification and D is known as the distortion coefficient. A square will thus be imaged as a barrel shaped body or pin cushion shaped body depending on the sign of D.

Spiral distortion is sometimes known as anisotropic distortion. An electron that leaves an object point ($X_o$, $Y_o$) now intercepts the image plane at ($X_i$, $Y_i$), where, for example, $$X_i = M[X_o - dy_o(X_o^2 + Y_o^2)]$$

$$Y_i = M[Y_o + dx_o(X_o^2 + Y_o^2)]$$

where d is the anisotropic distortion coefficient. A square will be imaged into the pocket handkerchief shape.

As used in the specification and claims, the terms "upper" and "lower" pole pieces do not necessarily mean higher and lower relative to the ground level. The "upper" pole piece is that piece nearest the direction from which electrons approach the lens and the "lower" pole piece is nearest the direction to which electrons exit the lens.

Having thus described the invention with the detail and particularity required by the Patent Laws, what is desired protected by Letters Patent is set forth in the following claims.

I claim:

1. An electron lens consisting of upper, middle and lower magnetic pole pieces installed inside a yoke enveloping two excitation coils so that magnetic fields are generated with opposite and same strength excitation in the two gaps respectively between said three magnetic pole pieces, and wherein the spacing ratio S1/S2, in which S1 represents the axial gap between the upper and middle pole pieces and S2 represents the axial gap between the middle and lower pole pieces, is in the range of 2.7 to 3.8 such that radial and spiral distortion are reduced.

2. An electron lens according to claim 1 wherein said two excitation coils are connected in series with respect to each other and supplied with the current from the same lens power supply.

3. An electron lens according to claim 1 wherein the spacing ratio S1/S2 is about 3.2.

4. An electron lens according to claims 1, 2, or 3 wherein the bore diameter d1 of the upper pole piece is larger than the bore diameter d2 of the middle pole piece and the bore diameter d2 is larger than the bore diameter d3 of the lower pole piece.

5. An electron lens according to claims 1, 2, or 3 wherein the bore diameters of the upper, middle and lower pole pieces, d1, d2, and d3 respectively, are equal to one another.

* * * * *